(12) United States Patent
Barnes et al.

(10) Patent No.: US 6,841,006 B2
(45) Date of Patent: Jan. 11, 2005

(54) ATMOSPHERIC SUBSTRATE PROCESSING APPARATUS FOR DEPOSITING MULTIPLE LAYERS ON A SUBSTRATE

(75) Inventors: Michael Barnes, San Ramon, CA (US); Michael S. Cox, Davenport, CA (US); Canfeng Lai, Fremont, CA (US); John Parks, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/938,399

(22) Filed: Aug. 23, 2001

(65) Prior Publication Data

US 2003/0039766 A1 Feb. 27, 2003

(51) Int. Cl.⁷ .............................. C23C 16/00; C23F 1/00; B65G 49/07
(52) U.S. Cl. .............. 118/719; 156/345.31; 156/345.32; 204/298.25; 414/939
(58) Field of Search ..................................... 204/298.25

(56) References Cited

U.S. PATENT DOCUMENTS

| | | | | |
|---|---|---|---|---|
| 4,003,770 A | * | 1/1977 | Janowiecki et al. ........... 438/97 |
| 5,151,008 A | * | 9/1992 | Ishida et al. .............. 414/744.5 |
| 5,185,132 A | * | 2/1993 | Horiike et al. ......... 422/186.05 |
| 5,319,247 A | * | 6/1994 | Matsuura ..................... 257/760 |
| 5,338,362 A | * | 8/1994 | Imahashi ..................... 118/719 |
| 5,413,671 A |   | 5/1995 | Ketchum |
| 5,451,259 A |   | 9/1995 | Krogh |
| 5,501,739 A | * | 3/1996 | Yamada et al. ............. 118/719 |
| 5,522,275 A | * | 6/1996 | Mauletti ................... 74/490.03 |
| 5,540,384 A |   | 7/1996 | Erickson et al. |
| 5,562,772 A | * | 10/1996 | Neoh ........................... 118/52 |
| 5,578,130 A | * | 11/1996 | Hayashi et al. .......... 118/723 E |
| 5,622,752 A |   | 4/1997 | Erickson et al. |
| 5,626,677 A | * | 5/1997 | Shirahata .................... 118/719 |
| 5,627,089 A |   | 5/1997 | Kim et al. |
| 5,849,088 A | * | 12/1998 | DeDontney et al. ........ 118/719 |
| 5,855,957 A |   | 1/1999 | Yuan |
| 5,934,856 A | * | 8/1999 | Asakawa et al. ........... 414/217 |
| 6,066,575 A |   | 5/2000 | Reardon et al. |
| 6,143,080 A | * | 11/2000 | Bartholomew et al. ..... 118/718 |
| 6,275,744 B1 | * | 8/2001 | Yoshida ...................... 700/218 |
| 6,342,275 B1 | * | 1/2002 | Miyakawa et al. ......... 427/488 |
| 6,451,118 B1 | * | 9/2002 | Garriga ...................... 118/715 |
| 6,559,070 B1 | * | 5/2003 | Mandal ...................... 438/781 |

OTHER PUBLICATIONS

Peter Van Zant, "Atmospheric Pressure CVD Systems", Microchip Fabrication, A Practical Guide to Semiconductor Processing, (1997), 359–363, Third Edition.

Roy G. Gordon, et al., "Silicon Dimethylamido Complexes and Ammonia as Precursors for the Atmospheric Pressure Chemical Vapor Deposition of Silicon Nitride Thin Films", Chem. Mater., (1990), pp. 480–482, vol. 2, No. 5.

M. L. Hammond, "Epitaxial Silicon Reactor Technology—A Review; Part I: Reactor Technology", Solid State Technology, (May 1988), pp. 159–164.

V. Y. Doo, et al., "Preparation and Properties of Pyrolytic Silicon Nitride", Journal of the Electrochemical Society, (Dec. 1966), pp. 1279–1281, vol. 113, No. 12.

Geert Jansen, "Atmospheric Pressure Chemical Vapor Deposition of SiN using SiI₄ and NH₃ as precursors", (Sep. 6, 1999), 32 pgs.

* cited by examiner

*Primary Examiner*—Parviz Hassanzdeh
*Assistant Examiner*—Karla Moore
(74) *Attorney, Agent, or Firm*—Townsend & Townsend & Crew

(57) ABSTRACT

A substrate processing apparatus is disclosed. In one embodiment, the apparatus includes a first atmospheric deposition station and a second atmospheric deposition station. The second atmospheric deposition station comprises an atmospheric pressure vapor deposition chamber. A substrate handling system is adapted to transfer substrates between the first and the second atmospheric deposition stations.

11 Claims, 5 Drawing Sheets

ATMOSPHERIC SUBSTRATE PROCESSING APPARATUS FOR DEPOSITING MULTIPLE LAYERS ON A SUBSTRATE

BACKGROUND OF THE INVENTION

A typical semiconductor fabrication facility can cost billions of dollars. In view of the high capital costs associated with building and maintaining a semiconductor fabrication facility, it would be desirable to decrease the time needed to process semiconductor wafers into chips. By reducing the cycle time for chip production, more chips can be produced in less time, thus maximizing the use of equipment in a fabrication facility.

One time-consuming processing step in a chip manufacturing process is the evacuation and re-pressurization of load-locks, transfer chambers, and processing chambers. For example, FIG. 1 shows a deposition module 120 that can be used to deposit layers on semiconductor substrates. In operation, a loadlock chamber 124 in a front end staging area 122 is loaded with cassettes containing semiconductor substrates and is pumped down to near vacuum. The front staging area 122 can be connected to another processing module (not shown).

A transfer chamber 126 adjacent to the staging area 122 is pumped down to vacuum or near vacuum using one or more vacuum pumps (not shown) disposed on the deposition module 120. After vacuum pumping to a sufficiently low pressure, the vacuum doors 128 of the transfer chamber 126 open so that the transfer chamber 126 and the front end staging area 122 are in communication with each other. Movable arms on a substrate handler 127 in the transfer chamber 126 retrieve substrates from the loadlock chamber 124. The substrate handler 127 in the transfer chamber 126 then transfers the substrates into the processing regions 618, 620 of one of the processing chambers 130.

Once the semiconductor substrates are placed in the processing chambers 130, the arms of the substrate handler 127 are withdrawn. The slit valves 132 to the processing chamber 130 are then closed. Other processing chambers may be loaded with substrates in a similar manner. In each processing chamber 130, layers of material (e.g., capping layers) are respectively deposited on the substrates using, for example, a plasma enhanced chemical vapor deposition (PECVD) process. After processing is finished, the slit valves 132 are opened and the arms of the substrate handler 127 retrieve the substrates from the processing regions 618, 620. The substrates are then returned to the loadlock chamber 124. Then, the substrate handler 127 retrieves another pair of substrates from the loadlock chamber 124, and the processing continues in the same manner.

After all of the substrates in the loadlock chamber 124 are processed, the slit valves 132 to the processing chambers 130 are closed. The transfer chamber 126 is then vented to atmosphere pressure using an inert gas (e.g., argon) and the front vacuum doors 128 are opened. Another substrate handler (not shown) can then retrieve the processed substrates from the loadlock chamber 124.

A significant amount of time is needed to evacuate and re-pressurize the processing chambers, the transfer chamber, and the loadlock chambers in the substrate processing apparatus. It would be desirable to reduce the time associated with one or more of these steps to reduce the amount of time needed to process the substrate. Doing so would increase processing efficiency and would reduce the cycle time associated with manufacturing, for example, semiconductor chips.

Embodiments of the invention address this and other problems.

SUMMARY OF THE INVENTION

Embodiments of the invention are directed to apparatuses and methods for processing substrates.

One embodiment of the invention is directed to an apparatus for processing a substrate, the apparatus comprising: (a) a first atmospheric deposition station; (b) a second atmospheric deposition station comprising an atmospheric pressure vapor deposition chamber, wherein the first atmospheric deposition station and the second atmospheric deposition station are coupled together; and (c) a substrate handling system adapted to transfer substrates between the atmospheric deposition station and the second atmospheric deposition station.

Another embodiment of the invention is directed to an apparatus for processing semiconductor substrates, the apparatus comprising: (a) an atmospheric chemical vapor deposition chamber; (b) a plasma system associated with the atmospheric chemical vapor deposition chamber; (c) a spin coating chamber coupled to the atmospheric deposition chamber; (d) a curing station coupled to the atmospheric deposition chamber; and (e) a substrate handling system adapted to transfer substrates between the atmospheric deposition chamber, the spin coating chamber, and the curing station.

Another embodiment of the invention is directed to a method for processing a substrate using a substrate processing apparatus, the method comprising: (a) depositing a first layer on a substrate at atmospheric pressure at a first atmospheric deposition station; (b) transferring the substrate to an atmospheric vapor deposition chamber at a second atmospheric deposition station using a substrate transfer system; and (c) depositing a second layer on the substrate at atmospheric pressure within the atmospheric vapor deposition chamber at atmospheric pressure.

These and other embodiments of the invention are described in further detail below.

DETAILED DESCRIPTION

Figure 1:
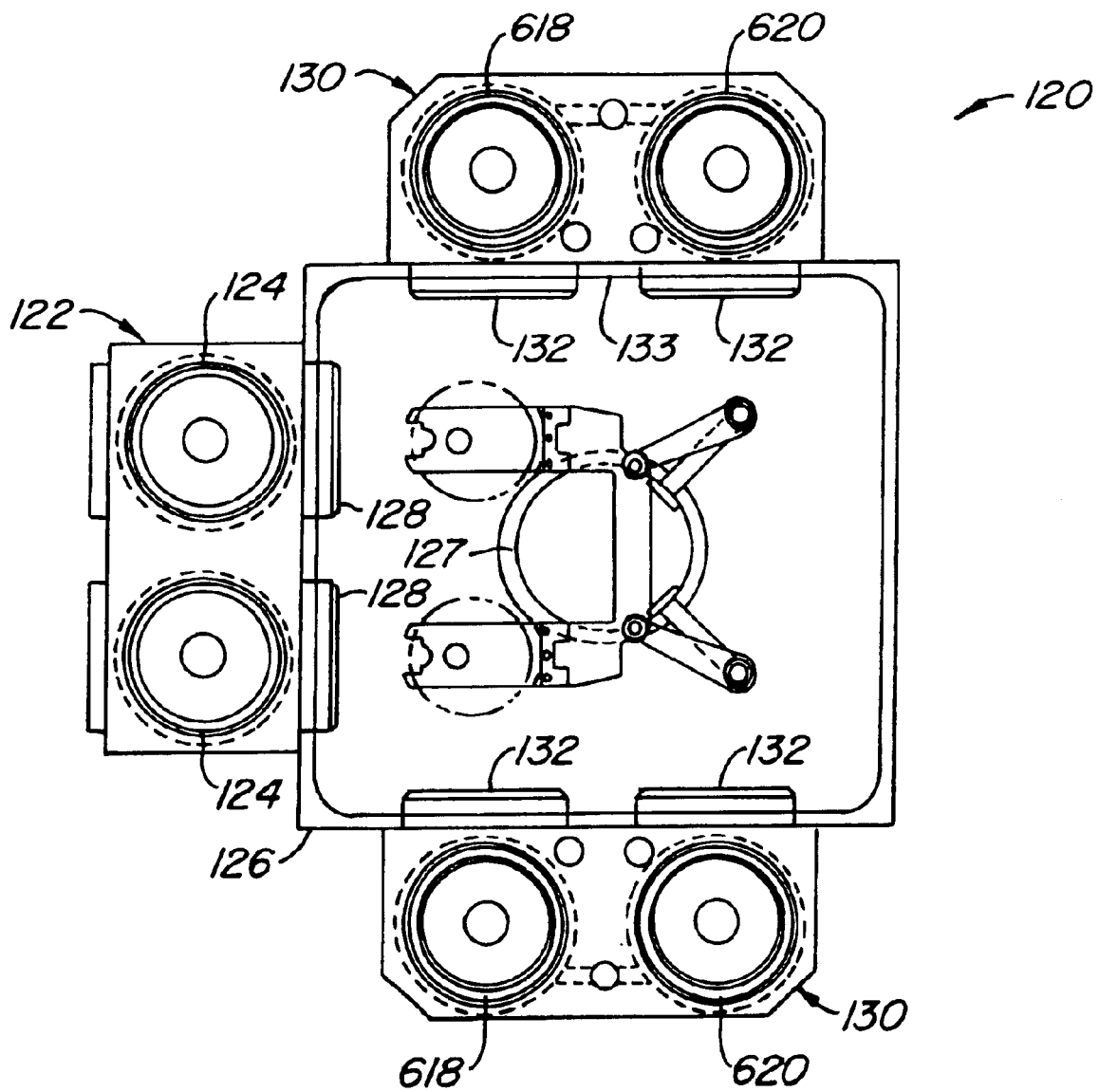
FIG. 1 shows a top view of a deposition module including process chambers.

Embodiments of the invention are directed to substrate processing apparatuses and methods for processing substrates. In one example, the apparatus comprises a first atmospheric deposition station and a second atmospheric deposition station. The second atmospheric deposition station comprises an atmospheric pressure vapor deposition chamber. An atmospheric pressure vapor deposition process such as an atmospheric pressure chemical vapor deposition (APCVD) process can be performed in the chamber.

Substrates are transferred between the first and second atmospheric deposition stations using a substrate handling system. The substrate handling system, or parts of the substrate handling system, may be housed in one or more transfer chambers. In the apparatus, the substrates may be directly or indirectly transferred from one atmospheric deposition station to another atmospheric deposition station. In a typical indirect transfer of substrates, substrates can be processed at an intermediate processing station after being processed at a first atmospheric deposition station, but before being processed at a second atmospheric deposition station. For example, a spin coating process may be performed at a first atmospheric deposition station, a curing process may be performed at an intermediate processing station, and an APCVD process may be performed at a second atmospheric deposition station.

In embodiments of the invention, the first atmospheric pressure deposition station may be directly or indirectly coupled to the second atmospheric deposition station. For example, the first and the second atmospheric deposition stations may be indirectly coupled together using one or more intervening process or transfer stations. The intervening stations may include, for example, process chambers (e.g., curing chambers) or transfer chambers that are disposed between the first and second atmospheric deposition stations. Together, the first atmospheric deposition station, the second atmospheric deposition station, and any optional processing or transfer stations may form a cluster tool.

Layers of material may be deposited at the first atmospheric station using any suitable process and any suitable process equipment. For example, the first atmospheric deposition station can have a liquid dispenser to dispense liquids. In this regard, the first atmospheric deposition station may include, for example, a spin coater with a spin coating chamber, a spray coater (e.g., an ultrasonic spray coater), a roller coater, or a curtain coater. In some embodiments, the liquid dispenser may have one or more nozzles. The one or more nozzles can dispense streams or droplets of liquid (e.g., a spray) on a substrate to form a first layer on the substrate.

The second atmospheric deposition station can comprise an atmospheric pressure vapor deposition chamber. In the chamber, a layer can be deposited using gas phase reactants. For example, an APCVD process or a plasma enhanced APCVD process may be performed at the second atmospheric deposition station to deposit a second layer on the substrate. The deposited first and second layers may be in direct contact with each other on the substrate or may be coupled together through one or more intervening layers.

Embodiments of the invention have a number of advantages. As the apparatus comprises a number of atmospheric deposition stations, processing chambers at these stations need not be evacuated and re-pressurized. The time associated with evacuating and re-pressurizing many different chambers is eliminated or reduced. As a result, substrates can be processed quickly and efficiently. Also, the apparatus embodiments have fewer vacuum pumps than conventional substrate processing apparatuses. For example, in some embodiments, all processing stations in the apparatus can process substrates at atmospheric pressure and no vacuum pumps are present in the apparatus. Reducing the number of vacuum pumps and other hardware associated with the vacuum pumps reduces the overall complexity of the apparatus. In addition, by using the substrate handling system to transfer substrates between the various processing stations in the apparatus, substrates can be processed continuously and automatically. Embodiments of the invention can generally provide higher throughout, smaller footprint, and lower costs than other conventional substrate processing apparatuses.

Figure 2:
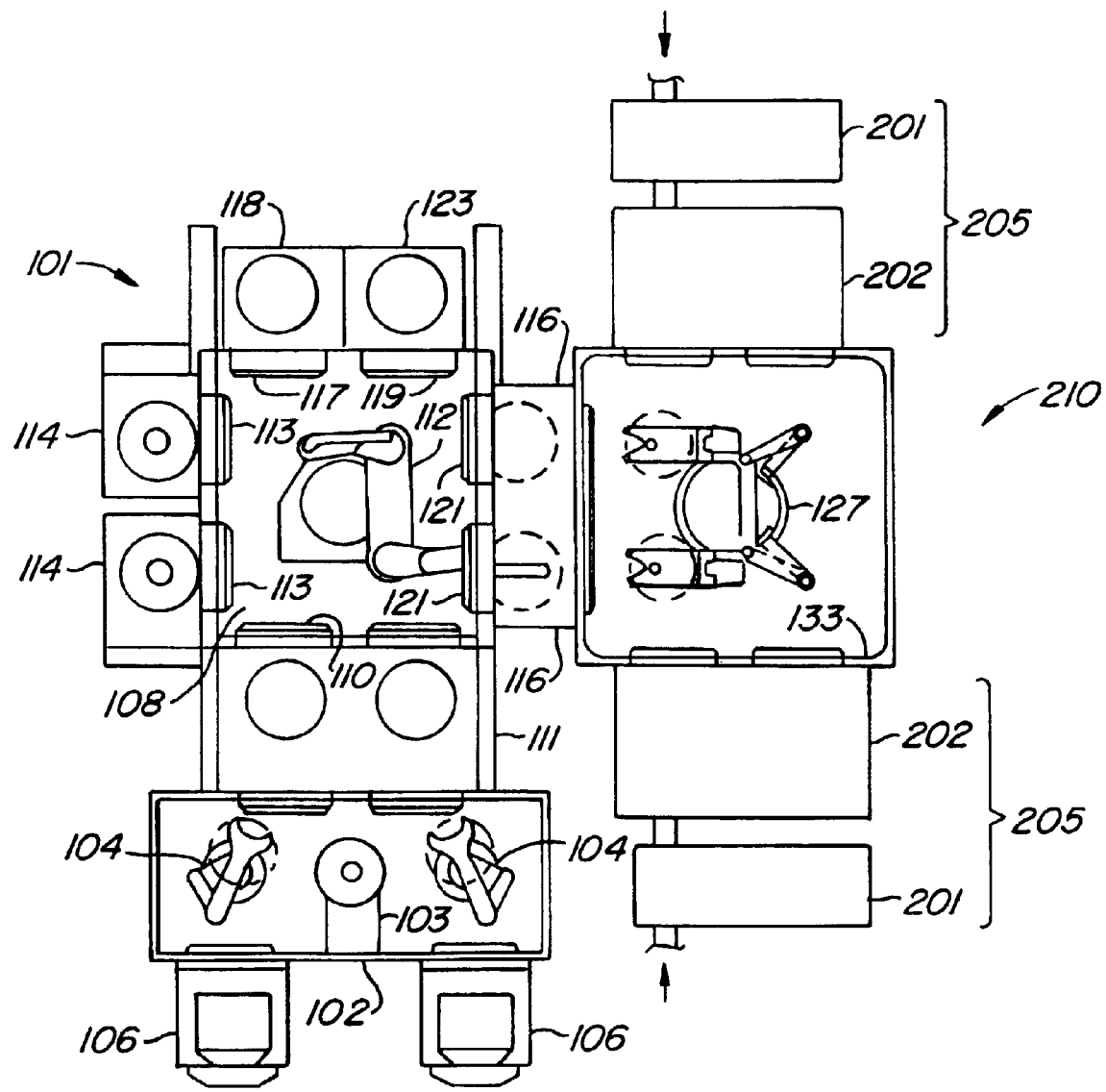
FIG. 2 shows a top view schematic view of a substrate processing apparatus according to an embodiment of the invention.

An example of a substrate processing apparatus according to an embodiment of the invention can be described with reference to FIG. 2. FIG. 2 shows an apparatus including a first process module 101 and a second process module 210. In this example, the first process module 101 and the second process module 210 are coupled together via a curing chamber 116.

When the apparatus processes a substrate, a first layer can be deposited on a substrate at a first atmospheric deposition station in the first process module 101. The substrate is typically a semiconductor substrate (e.g., a silicon wafer) and the first layer may be, for example, a sol-gel layer. Other processing stations may process the sol-gel layer into a porous dielectric layer. A second layer can be deposited on the substrate at a second atmospheric deposition station in the second process module 210. The second layer may be, for example, a capping layer. The capping layer may be on the substrate and in contact with the porous dielectric layer. Sol-gel layers, porous dielectric layers, and capping layers are examples of the many layers that may be deposited and formed using embodiments of the invention. These particular layers are described in greater detail below.

In the apparatus example shown in FIG. 2, the first process module 101 includes a plurality of processing stations and a transfer chamber 108. Each processing station may include a processing chamber. In this example, the first process module 101 includes a cooling station comprising a cooling chamber 111, a spin coating station having spin coating chambers 114, a curing station having a curing chamber 116, a stripping/annealing station having a stripping/annealing chamber 118, and a silylation station having a silylation chamber 123. Further details about exemplary process modules and the processing chambers in the first process module can be found in U.S. patent application Ser. No. 09/502,126, filed Feb. 10, 2000, which is assigned to the same assignee as the present invention and is herein incorporated by reference in its entirety for all purposes. In the example shown in FIG. 2, the various process chambers 111, 114, 116, 118, 123 are arranged around the transfer chamber 108. Each process chamber 111, 114, 116, 118, 123 is in communication with the interior of the transfer chamber 108 through various slits 110, 113, 117, 119, 121.

A substrate handler 112 with arms is present in the transfer chamber 108. The arms of the substrate handlers 112 can move in a radial direction to insert substrates into the various process chambers 111, 114, 116, 118, 123 or remove substrates from them. In this example, the substrate handler 112 has two arms with independent rotational movement. Alternatively, the two armed substrate handler 112 may have arms that move in tandem.

In the apparatus shown in FIG. 2, the spin coating station comprising the spin coating chambers 114 may be considered a first atmospheric deposition station. A spin coating process can be used to deposit a liquid on a substrate at atmospheric pressure in each of the spin coating chambers 114. In a typical spin coating process, a liquid is dispensed onto a substrate and is initially deposited as a puddle or stream over one part of the substrate. During or after liquid deposition, the substrate spins and centrifugal forces distribute the liquid evenly across the surface of the spinning substrate to form a coating on the substrate. The coated substrate can then be baked or cured in the curing chamber 116. The baking or curing process may also be performed at atmospheric pressure. Accordingly, in some embodiments of the invention, some or all of the stations and chambers in the apparatus may operate at atmospheric pressure.

In other embodiments, the first atmospheric deposition station can have an ultrasonic spray chamber (not shown). An ultrasonic spraying process may be used to form a layer on a substrate. In an ultrasonic spraying process, an ultrasonic spray nozzle is positioned above the substrate and breaks up the process liquid into a fine mist. The spray nozzle is on an arm that moves from the center to the edge of the wafer, or vice-versa. During spraying, a spray envelope extends over a broad area of the substrate so that the entire surface of the substrate can be covered with the sprayed liquid. The substrate may or may not be rotated while spraying.

Compared with conventional pressure spray nozzles, ultrasonic nozzles deliver a low-velocity spray. For example, in a typical ultrasonic spray process, the spray velocity is approximately $\frac{1}{100}^{th}$ of that produced by an ordinary pressure nozzle so excess spraying is minimized. Minimizing overspraying reduces the amount of liquid that is released into the environment and reduces the amount of liquid that is wasted during processing. Also, because overspraying is minimized, the amount of liquid deposited on the backside of the substrate is minimized. This can eliminate the need for, or reduce the time associated with, a subsequent back side rinse process. In a back side rinse process, the back surface of a substrate is rinsed of any liquid that was previously deposited on the front surface of the substrate.

The stripping/annealing chamber 118 is capable of performing one or both of a non-reactive gas anneal and an oxidizing gas strip of a deposited layer. An example of a stripping/annealing chamber 118 is the WxZ™ chamber that is commercially available from Applied Materials, Inc., of Santa Clara, Calif. Undesired substances may be removed from a deposited layer using an annealing or a stripping process. For example, during the formation of a mesoporous oxide layer, surfactants can be removed from a cured sol-gel layer by annealing the cured layer and/or exposing the cured layer to an oxidizing atmosphere. A high temperature anneal can also transform a cured sol-gel layer into a mesoporous oxide layer.

The silylation chamber 123 can be used to perform a silylation process. In a silylation process, a layer on a substrate is exposed to a silylating agent. Examples of silylating agents include tetramethyl disilazane (TMDS), hexamethyl disilazane (HMDS), and dimethylaminotrimethyl silane, and combinations thereof. During silylation, the substrate may be at a temperature of about 25° C. to about 200° C. Many mesoporous oxide layers, for example, are hydrophilic after they are formed. Silylating a hydrophilic layer on a substrate can render the layer hydrophobic. Hydrophobic layers are less likely to retain moisture than hydrophilic layers. As explained in further detail below, moisture can affect the properties of dielectric and conductive layers in an interconnect structure.

The first process module 101 may also include a front staging area 102 coupled to the transfer chamber 108. Substrate handlers 104 are in the front staging area 102. The substrate handlers 104 can transfer substrates between substrate cassettes 106 that are coupled to the front staging area 102 and the cooling chamber 111. The substrate cassettes 106 are adapted to support a plurality of substrates mounted in a spaced vertical arrangement. A substrate rest 103 is disposed between the handlers 104 to provide a cooling rest for substrates during substrate exchange between the cooling chamber 111 and the cassettes 106. Alternatively, the substrate rest 103 may preheat the substrates for subsequent processing. The cooling chamber 111 may cool the substrates for subsequent processing or prior to exiting the apparatus.

The second process module 210 includes one or more atmospheric pressure vapor deposition stations 205 that are coupled together through a transfer chamber 133. Each station 205 includes an atmospheric pressure vapor deposition chamber 202 and an optional remote plasma chamber 201. Each atmospheric pressure vapor deposition station 205 may have one or more gas distribution assemblies (not shown). The gas distribution assemblies may uniformly distribute process gases onto the substrates within the atmospheric pressure vapor deposition chambers 202. A substrate handler 127 is in the transfer chamber 133 and inserts substrates into or retrieves substrates from the atmospheric vapor deposition chambers 202. Having the substrate handler 127 in the transfer chamber 133 reduces the likelihood that contamination from the outside environment may deposit on the substrates being handled. The substrate handler 127 may be the same or different than the previously described substrate handlers.

The atmospheric pressure vapor deposition processes performed in the atmospheric vapor deposition chambers 202 may be non-reactive or reactive. Examples of non-reactive deposition processes include evaporation and sputtering. In other embodiments, a reactive deposition process may be performed in the processing chamber. Examples of reactive deposition processes include atmospheric pressure chemical vapor deposition (APCVD) processes and plasma enhanced APCVD processes. APCVD processes are especially suitable for forming compound layers, i.e. layers of materials formed from at least two different elements such as silicon nitride, silicon oxynitride, silicon dioxide, aluminum oxide, aluminum nitride, titanium oxide, etc.

In an APCVD process, a non-volatile solid layer is formed on a substrate by a surface reaction of gaseous reactants. A typical APCVD process comprises (1) introducing gaseous reactants and inert carrier gas into a reaction chamber, (2) transporting gaseous reactants to the surface of the substrate, (3) adsorbing reagent species onto the substrate where they undergo migration and film forming reactions, and (4) removing gaseous reaction byproducts and unused reactants from each chamber. The APCVD chamber is at or near atmospheric pressure during deposition.

In general, APCVD processes have higher deposition rates than LPCVD (low pressure chemical vapor deposition) processes. Accordingly, APCVD processes can deposit a layer of material on a substrate faster than typical LPCVD processes. In order to improve the uniformity of the layers deposited using APCVD processes, the reactant gases in the chamber can be agitated and/or the substrate being processed can be moved during the deposition process. For example, many APCVD apparatuses have a moving substrate holder that supports and moves substrates during the deposition process.

The substrate can be heated in an APCVD process to drive the reaction at the surface of the substrate. For faster reaction rates, the substrates are typically heated to temperatures ranging from about 500° C. to as high as about 1600° C. Heat is supplied to the substrate in any suitable manner. For example, heat can be supplied to the substrate by heating a susceptor that supports the substrate. The susceptors can be heated by, for example, resistive or inductive heating.

Process parameters such as the process gas composition, the process gas flowrates, the substrate temperature, and the chamber wall temperatures may be adjusted according to the particular layers being deposited. In this regard, specific processing recipes can be created for the particular layers being deposited. The particular recipes can be created and stored in a computer at the atmospheric deposition station and can be determined by those of ordinary skill in the art.

Any suitable APCVD reactor can be used in the atmospheric vapor deposition station 205. Examples of APCVD reactors include cold-wall induction APCVD reactors, pancake induction heated APCVD reactors, continuous conduction heated APCVD reactors, and horizontal conduction heated APCVD reactors. These reactors are well known in the art. Some examples of suitable APCVD reactors are shown in FIGS. 3 and 4.

Figure 3:
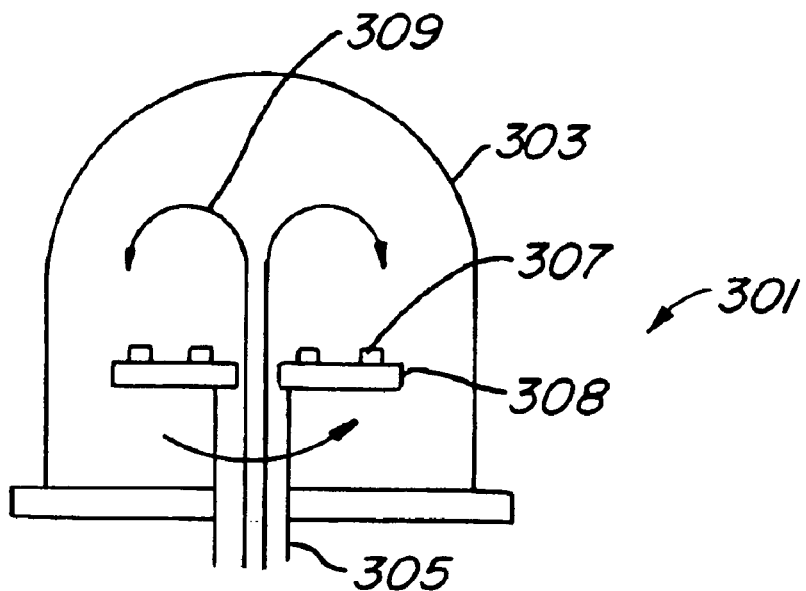
FIG. 3 shows a side schematic view of a pancake induction atmospheric pressure chemical vapor deposition reactor.

FIG. 3 shows an example of a pancake induction heated APCVD system. In the illustrated APCVD system, semiconductor substrates 307 are on a rotating holder 308 of graphite. Both the substrates 307 and the rotating holder 308 are present within an APCVD chamber 303. The graphite holder 308 is heated by induction using an RF coil (not shown) below the holder 308. Reaction gases 309 are fed through a tube 305 under the holder 308 and exit the holder 308 above the substrates 307. The holder 308 rotates and the reactant gases 309 react at the surface of the substrates 307 to form layers of material.

In a pancake induction heated APCVD system, the reactant gases flow vertically with respect to the substrate. Vertical gas flow offers the advantage of a continuous supply of fresh reactants to the wafers, thus minimizing downstream depletion. The combination of the substrate rotation and the vertical flow of the gases produces good uniformity in the deposited layer.

Figure 4:
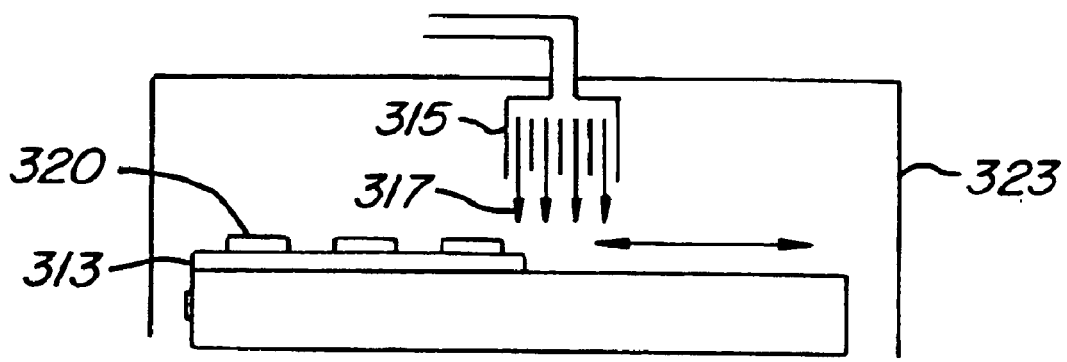
FIG. 4 shows a side schematic view of a horizontal conduction atmospheric pressure chemical vapor deposition reactor.

FIG. 4 shows an example of a horizontal conduction heated APCVD system. In this embodiment, gases 317 are mixed outside of the chamber 323 and the mixed gases 317 pass to a showerhead 315. The showerhead 315 distributes the gases 317 on the substrates 320. As this distribution occurs, a hot plate holder 313 moves back and forth under the showerhead 315. The gases 317 react at the surfaces of the substrates 320 to form layers of material on the substrates 320.

In some embodiments, the APCVD process is a plasma enhanced APCVD process. In a plasma enhanced APCVD process, energy is applied to reactant gases to form a plasma containing reactive ions. The plasma may be generated in the deposition chamber or may be generated in a remote chamber. The remote chamber is positioned upstream of the deposition chamber. For example, in the embodiment illustrated in FIG. 2, a plasma is formed in the remote plasma chamber 201 that is upstream of a corresponding deposition chamber 202. The plasma in the remote plasma chamber 201 may be generated using any suitable form of energy. For example, RF (radio frequency), RF resonant, microwave, or corona energy may be used to generate a plasma. The formed gaseous ions can pass downstream of the remote plasma chamber 201 and into the atmospheric vapor deposition chamber 202 where they react at the surface of the substrate. In general, plasma enhanced processes can deposit layers on a substrate more quickly and at lower temperatures than non-plasma enhanced processes.

Any suitable substrate handling system can be used in the apparatus to facilitate the movement and transfer of the substrates between the processing stations and chambers within the apparatus. For example, the substrate handling system may comprise any suitable combination of track systems, conveyor belts, armed substrate handlers, etc. Such components may operate dependently or independently of each other. For instance, in the apparatus shown in FIG. 2, the substrate handling system includes a first substrate handler 112 and a second substrate handler 127. The first and second substrate handlers 112, 127 may work independently or dependently to transfer substrates from the spin coating chambers 114 of the first process module 101 to the atmospheric deposition chambers 202 of the second process module 210.

In other embodiments, a plurality of different process stations may be separated from each other by conveyor belts and substrate handlers that transfer the substrates between adjacent stations. Illustratively, a spin coating chamber, a curing chamber, a stripping/annealing chamber, and an APCVD chamber may form a process line. Substrates can be transferred between adjacent chambers using conveyors and/or substrate handlers that are disposed between the chambers. Substrates can be sequentially processed in the spin coating chamber, curing chamber, stripping/annealing chamber, and the APCVD chamber. In these and other embodiments, a batch of substrates can be substantially continuously processed without manual intervention.

Figure 5:
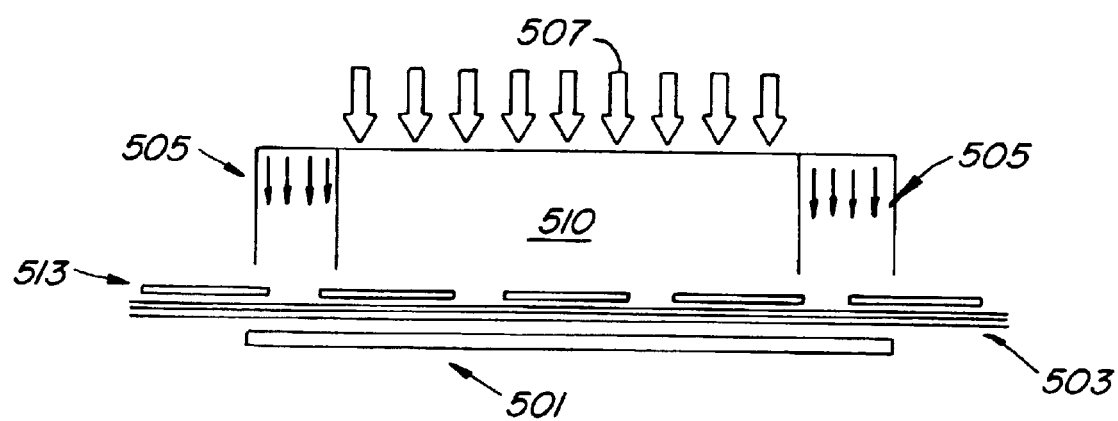
FIG. 5 shows a side schematic view of a continuous atmospheric pressure chemical vapor deposition reactor.

An example of an APCVD reactor that can be used in a continuous process line is shown in FIG. 5. FIG. 5 shows a reaction chamber 510 that receives process gases 507. A noble gas (e.g., argon or nitrogen) "curtain" 505 can be disposed on opposite sides of the reaction chamber 510 to confine the process gases 507. Substrates 513 can pass under the process gases 510 as they are transported by a conveyor belt 503. A heater 501 may be under the conveyor belt 503 to heat the substrates 513 on a conveyor belt 503 to a suitable process temperature. Using the apparatus shown in FIG. 5, substrates can be processed in a truly continuous fashion. For example, substrates can be loaded at one end of the reactor and then unloaded at another end of the reactor using substrate handlers. The substrates can be transferred to the reactor from a preceding process station and away from the reactor to another subsequent process station using conveyors. Thus, one or more other process stations may be coupled to either end of the reactor so that more than one layer of material can be deposited on the substrates 513 in an automated processing sequence. For example, a spin coating station or an ultrasonic spray station may be precede and may be coupled to the reactor shown in FIG. 5 to form an apparatus that can deposit multiple layers on substrates.

As noted, a first layer may be formed on a substrate at the first atmospheric deposition station and a second layer may be formed on the substrate at the second atmospheric deposition station. The first and second layers may have any suitable characteristics. For example, each of the first layer and the second layer may be a dielectric or conductive layer, or a precursor to a dielectric or conductive layer. Either layer may be porous or solid. In addition, if the first or the second layer comprises or is formed into a dielectric layer, the dielectric layer may comprise materials such as silicon dioxide, silicon nitride, silicon oxynitride, metal oxides such as titanium oxide, etc.

In some embodiments, the first layer and the second layer may both be layers with dielectric properties. For example, the first layer may be a dielectric layer while the second layer may be a dielectric capping or barrier layer. In other embodiments, the first layer may comprise a dielectric material while the second layer comprises a conductive material. In yet other embodiments, the first and the second layers may both be conductive.

The first and the second layers may also be precursors to a final layer or a final layer in a semiconductor chip. For example, the first layer may be a precursor layer to a porous dielectric layer such as a mesoporous oxide layer. The precursor layer may be a sol-gel layer that is later formed into a dielectric mesoporous oxide layer using additional processes such as curing and stripping. The second layer may be a layer such as a dielectric capping layer that is formed using an atmospheric vapor deposition process. In this example, the dielectric mesoporous oxide layer and the capping layer may be in direct contact with each other.

Figure 6:
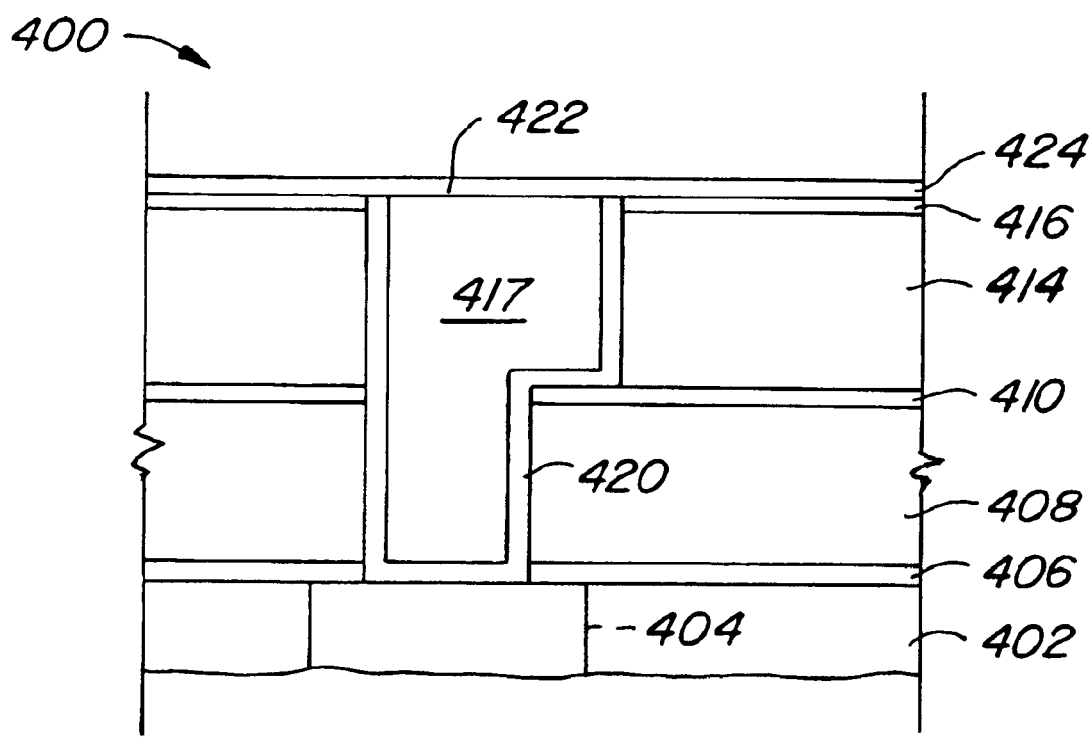
FIG. 6 shows side cross-sectional views of layers that can be deposited using an apparatus according to an embodiment of the invention.

Mesoporous oxide layers and capping layers can be used in an interconnect structure in a semiconductor chip. An exemplary interconnect structure 400 is shown in FIG. 6. In FIG. 6, a first mesoporous oxide 408 is on a substrate 402 that has a pattern of conducting lines 404. A first capping layer 406 is between the first dielectric layer 408 and the substrate 402. The first dielectric layer 408 may comprise a mesoporous oxide. A second capping layer 410 is on the first dielectric layer 408 and may have the same or different characteristics as the first capping layer 406. A second dielectric layer 414 may comprise a mesoporous oxide layer and is disposed over the second capping layer 410. A third capping layer 416 is on the second dielectric layer 408. A conductive via 417 and a barrier layer 420 may pass through the capping layers and the dielectric layers. The conductive via 417 and the conducting lines 404 may comprise any suitable conductive material including copper, aluminum, or tungsten. A fourth capping layer 424 may be on the third capping layer 416. The barrier layer and the capping layers may comprise any suitable material including, for example, refractory metal nitrides (e.g., tantalum nitride), refractory metals (e.g., tantalum, tungsten), silicon carbides (e.g., amorphous silicon carbide), silicon oxides (e.g., silicon dioxide), silicon nitrides, silicon oxynitrides, etc.

Mesoporous oxide layers are desirable as dielectric layers. They have a low dielectric constant and are suitable dielectric barriers between copper layers. However, mesoporous oxide layers are highly hydrophilic and are sensitive to moisture contamination. Moisture contamination can alter the dielectric constant of a dielectric layer. For example, if water, which has a dielectric constant (k) of about 78, is absorbed by the mesoporous oxide layer, then the low dielectric constant properties of the mesoporous oxide layer can be unintentionally altered.

In general, moisture in a porous dielectric layer can be generated during formation of the porous dielectric layer and can remain within the pores of the layer. The moisture can diffuse to the surface of an adjacent conductive metal layer and can increase its resistivity. Accordingly, it is desirable to remove moisture from porous dielectric layers such as mesoporous oxide layers. Porous dielectric layers such as mesoporous oxide layers may be annealed to remove moisture. However, it is more desirable to deposit a capping layer on the porous layer and/or make the porous layer hydrophobic. By doing so, additional moisture is inhibited from entering the pores of the porous layer. In addition to serving as a moisture barrier, the capping layer may also serve as an etch stop layer or a hard mask during the fabrication of an interconnect structure.

A method of forming mesoporous oxide layers and capping layers on substrates using an apparatus embodiment can be described with reference to FIG. 2. Referring to FIG. 2, substrate cassettes 106 containing substrates are coupled to the front staging area 102. The substrate handlers 104 index the substrates in each substrate cassette 106. Once indexed, the substrate handlers 104 transfer the substrates to the cooling chamber 111.

The substrate handler 112 retrieves substrates from the cooling chamber 110 and transfers the substrates to the spin coating chambers 114. In the spin-coating chambers 114, sol-gel layers are deposited on the substrates using spin coating processes. Alternatively, the sol-gel layers can be formed using spray coating processes (e.g., ultrasonic spray coating).

The sol-gel solution used to form the sol-gel layer can contain a mixture comprising silicon/oxygen compounds, water, and a surfactant in an organic solvent. An exemplary sol-gel solution may be a mixture of tetraethylorthosilicate (TEOS), ethanol, water, and a polyethylene oxide surfactant. An optional acid or base catalyst may be further used in the formation of the sol-gel solution.

The silicon/oxygen compounds in the sol-gel solution are those conventionally used in the deposition of silicon containing layers in semiconductor manufacturing. Examples of silicon/oxygen compounds include silica, tetraethoxysilane (TEOS), phenyltriethyloxy silane, methyltriethoxy silane, etc.

Surfactants are used to disperse the silicon/oxygen compounds in sol-gel solutions so that the concentration of materials in the formed sol-gel layer are uniform. The surfactants may be anionic, cationic, or non-ionic. Non-ionic surfactants have chemical functional groups that are uncharged or neutral hydrophilic groups while anionic and cationic surfactants have functional groups respectfully charged negatively and positively. Examples of suitable surfactants include primary amines, polyoxyethylene oxides, ethylene glycol ethers, etc.

Any suitable solvent may be used in the sol-gel solution. Examples of suitable solvents include organic solvents. Organic solvents can be alcohols such as ethanol, n-propanol, iso-propanol, n-butanol, sec-butanol, tert-butanol, ethylene glycol, etc.

Once the sol-gel solution has been deposited on the substrates, the substrate handler 112 retrieves the substrates and transfers the substrates to the curing chamber 116. The sol-gel layers on the substrates are then cured to remove solvent and water from the layers. During the curing step, organic solvent in the layer evaporates and moisture in the layer is removed. This increases the concentration of non-volatile surfactant and silicon/oxygen compounds in the layer. In some embodiments, the curing process may take place between about 50° C. and about 450° C. and may be performed for about one to ten minutes. The cured sol-gel layer for each substrate has interconnecting pores of uniform diameter.

Due to the length of curing process as compared to other processes, a larger number of curing chambers 116 can be coupled to the transfer chamber 108. For example, there may be eight curing chambers per two dual substrate spin coating chambers 114. The substrate handler 112 may be programmed to fill up the curing chambers 116 with spin-on deposited substrates prior to processing or may be programmed to load and unload substrates in the curing chamber 116 as desired.

After curing, the substrates can be transferred to a substrate stripping/annealing chamber 118. Annealing can be performed in the chamber 118 to remove surfactant from the cured sol-gel layer and to form a mesoporous oxide layer. For a high temperature non-reactive gas anneal, the stripping/annealing chamber 118 can be maintained at or near atmospheric pressure. The oxygen concentration inside the stripping/annealing chamber 118 can be controlled to less than about 100 ppm during annealing. In some embodiments, annealing can take place between about 200° C. and about 450° C. and for between about 30 seconds and about 30 minutes. In a typical rapid thermal annealing process, the temperature of the substrate can increase at a rate of at least 50° C. per second.

The cured sol-gel layer may also be exposed to an oxidizing environment to remove surfactant from the layer and to transform it into a mesoporous oxide layer. In a typical oxidation stripping process, the stripping/annealing chamber 118 can be maintained at about a pressure from about 1 Torr to about 10 Torr. The cured sol-gel layer can be exposed to an oxidizing gas comprising, for example, oxygen, ozone, or oxygen ions at high temperatures. The oxidizing gas flow into the stripper/annealing chamber 118 can be maintained at a high flow rate (e.g., greater than 20 liters/min) to thoroughly expose the layer to the gas. In some embodiments, the substrate may be heated to between about 200° C. to about 450° C. for between about 30 seconds and 30 minutes during stripping.

In some embodiments, the oxidizing gas used in the stripping process may comprise oxygen ions. The oxygen ions may be formed in a plasma chamber using an RF generator or a microwave generator to form a remote plasma. The formed oxygen ions pass downstream of the plasma chamber into the stripping chamber. In the stripping chamber, the oxygen ions react with any surfactant and solvent in the layer to remove them from the layer. In some embodiments, if oxygen ions are used in the stripping process, the substrate can be exposed to the process gas for about 0.5 minutes to about 5 minutes to remove the surfactant.

The formed mesoporous oxide layer is highly porous, and may have a porosity of greater than 50%. It may also have a dielectric constant of less than 2.5. For example, the mesoporous oxide layer may have a dielectric constant of about 1.6 to about 2.2.

Optionally, the mesoporous oxide layer may be silylated in the silylation chamber 123. As noted above, the mesoporous oxide layer may be rendered hydrophobic by using a silylation process.

After completing any stripping, annealing, or silylation processes, the substrate handler 112 retrieves the substrates from the stripping/annealing chamber 118 or the silylation chamber 123. The substrate handler 112 in the first process module 101 may then directly or indirectly transfer the substrates to the substrate handler 127 in the second process module 210. The substrate handler 127 in the second process module 210 then places the substrates in the APCVD chambers 202.

In the APVCD chambers 202, capping layers can then be deposited over the mesoporous oxide layers on the substrates. For example, reactant gases for plasma enhanced APCVD processes may be fed to one of the plasma chambers 201. When the gases are in the plasma chamber 201, ionizing energy may be applied to the gases to form a plasma. The ions from the plasma pass downstream of the plasma chamber 201 to the processing chamber 202. Once the ionized process gases are in the processing chamber 202, they contact the surfaces of the substrates and react on the surfaces to form layers of material on the substrates. The substrates may be moving during the deposition process to improve the thickness uniformity of the deposited layers. Capping layers are then formed on the mesoporous oxide layers on the substrates. The processing chamber 202 is at or near atmospheric pressure during the deposition process.

In other embodiments, a plasma need not be formed in the APCVD process. Illustratively, a silicon nitride capping layer can be formed on a mesoporous oxide layer without forming a plasma. The silicon nitride capping layer may be formed using silane and ammonia process gases. These gases can be introduced to a processing chamber and can react at the surface of the mesoporous oxide layer on the substrate in the chamber. The substrate temperature may be at about 700 to about 900° C. during deposition. A silicon nitride capping layer is subsequently formed on the mesoporous oxide layer. In this embodiment, the reactant gases need not be ionized to form the capping layer on the substrate. During the deposition process, the chamber may contain inert gases and may be at or near atmospheric pressure.

Although mesoporous oxide layer and capping layers are described in detail above, it is understood that embodiments of the invention are not limited to the formation of such layers on a substrate. Embodiments of the invention can be used to form any suitable combination of layers on a substrate.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

What is claimed is:

1. An apparatus for forming a first porous dielectric layer and a second capping layer on a semiconductor substrate, the apparatus comprising:
   (a) an atmospheric chemical vapor deposition chamber;
   (b) a plasma system associated with the atmospheric chemical vapor deposition chamber;
   (c) a spin coating chamber coupled to the atmospheric chemical vapor deposition chamber;
   (d) a curing station coupled to the atmospheric chemical vapor deposition chamber; and
   (e) a substrate handling system adapted to transfer substrates between the atmospheric chemical vapor deposition chamber, the spin coating chamber, and the curing station,
   wherein the spin coating chamber comprises a first material comprising a sol-gel solution used to form the first porous dielectric layer and wherein the atmospheric chemical vapor deposition chamber comprises a second material used to form the second capping layer, and wherein the curing chamber is capable of curing the sol-gel solution to form the first porous dielectric layer,
   wherein all processing stations in the apparatus are at atmospheric pressure and no vacuum pumps are present in the apparatus.

2. The apparatus of claim 1 wherein the plasma system is a remote plasma system adapted to generate a plasma upstream of the atmospheric chemical vapor deposition chamber.

3. The apparatus of claim 1 wherein the substrate handling system comprises a plurality of substrate handlers with arms.

4. The apparatus of claim 1 wherein the apparatus is a cluster tool.

5. The apparatus of claim 3 wherein the apparatus is a cluster tool.

6. An apparatus comprising:
   (a) a first atmospheric deposition station comprising a first material capable of forming a first dielectric layer on a semiconductor substrate;
   (b) a second atmospheric deposition station comprising an atmospheric pressure vapor deposition chamber and comprising a second material capable of forming a second dielectric layer on the semiconductor substrate, wherein the first atmospheric deposition station and the second atmospheric deposition station are coupled together; and
   (c) a substrate handling system adapted to transfer the substrate into and out of the first atmospheric deposition station and the second atmospheric deposition station, and
   wherein a plasma system is associated with the atmospheric pressure vapor deposition chamber, and
   wherein all processing stations in the apparatus are at atmospheric pressure and no vacuum pumps are present in the apparatus, and wherein the first atmospheric deposition station comprises a spin coating chamber.

7. An apparatus comprising:
   (a) a first atmospheric deposition station comprising a first material capable of forming a first dielectric layer on a semiconductor substrate;
   (b) a second atmospheric deposition station comprising an atmospheric pressure vapor deposition chamber and comprising a second material capable of forming a second dielectric layer on the semiconductor substrate, wherein the first atmospheric deposition station and the second atmospheric deposition station are coupled together; and
   (c) a substrate handling system adapted to transfer the substrate into and out of the first atmospheric deposition station and the second atmospheric deposition station, and wherein a plasma system is associated with the atmospheric pressure vapor deposition chamber, and wherein all processing stations in the apparatus are at atmospheric pressure and no vacuum pumps are present in the apparatus, wherein the first atmospheric deposition station comprises an ultrasonic spray deposition device.

8. The apparatus of claim 6 wherein the plasma system is a remote plasma system that is adapted to form a plasma upstream of the atmospheric pressure vapor deposition chamber.

9. An apparatus comprising:

(a) a first atmospheric deposition station comprising a first material capable of forming a first dielectric layer on a semiconductor substrate;

(b) a second atmospheric deposition station comprising an atmospheric pressure vapor deposition chamber and comprising a second material capable of forming a second dielectric layer on the semiconductor substrate, wherein the first atmospheric deposition station and the second atmospheric deposition station are coupled together; and (c) a substrate handling system adapted to transfer the substrate into and out of the first atmospheric deposition station and the second atmospheric deposition station, and wherein a plasma system is associated with the atmospheric pressure vapor deposition chamber, and wherein all processing stations in the apparatus are at atmospheric pressure and no vacuum pumps are present in the apparatus, and wherein the apparatus further comprises a curing station capable of curing the first material on the semiconductor substrate.

10. An apparatus comprising:

(a) a first atmospheric deposition station comprising a first material capable of forming a first dielectric layer on a semiconductor substrate;

(b) a second atmospheric deposition station comprising an atmospheric pressure vapor deposition chamber and comprising a second material capable of forming a second dielectric layer on the semiconductor substrate, wherein the first atmospheric deposition station and the second atmospheric deposition station are coupled together; and (c) a substrate handling system adapted to transfer the substrate into and out of the first atmospheric deposition station and the second atmospheric deposition station, and wherein a plasma system is associated with the atmospheric pressure vapor deposition chamber, and wherein all processing stations in the apparatus are at atmospheric pressure and no vacuum pumps are present in the apparatus, and wherein the first material comprises a sol-gel material.

11. The apparatus of claim 10 wherein the first dielectric layer is a porous dielectric layer, and the second dielectric layer is a capping layer.

* * * * *